United States Patent
Ogura et al.

(10) Patent No.: US 11,444,235 B2
(45) Date of Patent: Sep. 13, 2022

(54) VIBRATOR DEVICE, ELECTRONIC APPARATUS, AND VEHICLE

(71) Applicant: SEIKO EPSON CORPORATION, Tokyo (JP)

(72) Inventors: Seiichiro Ogura, Minowa-machi (JP); Ryuta Nishizawa, Nagano (JP); Keiichi Yamaguchi, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 386 days.

(21) Appl. No.: 16/811,796

(22) Filed: Mar. 6, 2020

(65) Prior Publication Data

US 2020/0284815 A1    Sep. 10, 2020

(30) Foreign Application Priority Data

Mar. 8, 2019    (JP) .............................. JP2019-042321

(51) Int. Cl.
| | |
|---|---|
| *H01L 41/053* | (2006.01) |
| *G01P 3/02* | (2006.01) |
| *H01L 23/552* | (2006.01) |
| *H01L 41/047* | (2006.01) |
| *H01L 41/113* | (2006.01) |

(52) U.S. Cl.
CPC .............. *H01L 41/053* (2013.01); *G01P 3/02* (2013.01); *H01L 23/552* (2013.01); *H01L 41/047* (2013.01); *H01L 41/1132* (2013.01); *H01L 41/1134* (2013.01)

(58) Field of Classification Search
CPC ......... H01L 41/09; H01L 23/02; H01L 23/04; H01L 23/053; H01L 23/12; H01L 23/15; H01L 23/52; H01L 23/535; H01L 23/538; H01L 25/16; H01L 25/165; H01L 23/552;
(Continued)

(56) References Cited

U.S. PATENT DOCUMENTS

| | | | |
|---|---|---|---|
| 2013/0036819 A1* | 2/2013 | Ichikawa | ........... G01C 19/5607 73/504.12 |
| 2013/0241359 A1* | 9/2013 | Naito | ................. H03H 9/02062 310/348 |

(Continued)

FOREIGN PATENT DOCUMENTS

| | | |
|---|---|---|
| JP | 2007-278920 A | 10/2007 |
| JP | 2012-172970 A | 9/2012 |
| JP | 2016-085179 A | 5/2016 |

*Primary Examiner* — Eduardo A Rodela
(74) *Attorney, Agent, or Firm* — Rankin, Hill & Clark LLP

(57) ABSTRACT

The vibrator device includes: a base; a circuit element disposed on the base; a vibrating element disposed to at least partially overlap the circuit element in a plan view; and a support substrate that is disposed between the circuit element and the vibrating element and supports the vibrating element. In addition, the vibrating element has a frequency adjustment portion that performs frequency adjustment by removing at least a part of the vibrating element, and the support substrate includes a base portion that supports the vibrating element, a support portion that supports the base portion, a beam portion that couples the base portion the support portion, and a shielding portion that is connected to the beam portion, overlaps the frequency adjustment portion in a plan view, and has light shielding properties.

11 Claims, 13 Drawing Sheets

(58) Field of Classification Search
CPC . H01L 41/047; H01L 41/053; H01L 41/1132; H01L 41/1134
See application file for complete search history.

(56) References Cited

U.S. PATENT DOCUMENTS

2013/0257553 A1* 10/2013 Ishii ................. H03H 9/177
  310/365
2016/0116285 A1   4/2016 Ogura et al.

* cited by examiner

FIG. 3
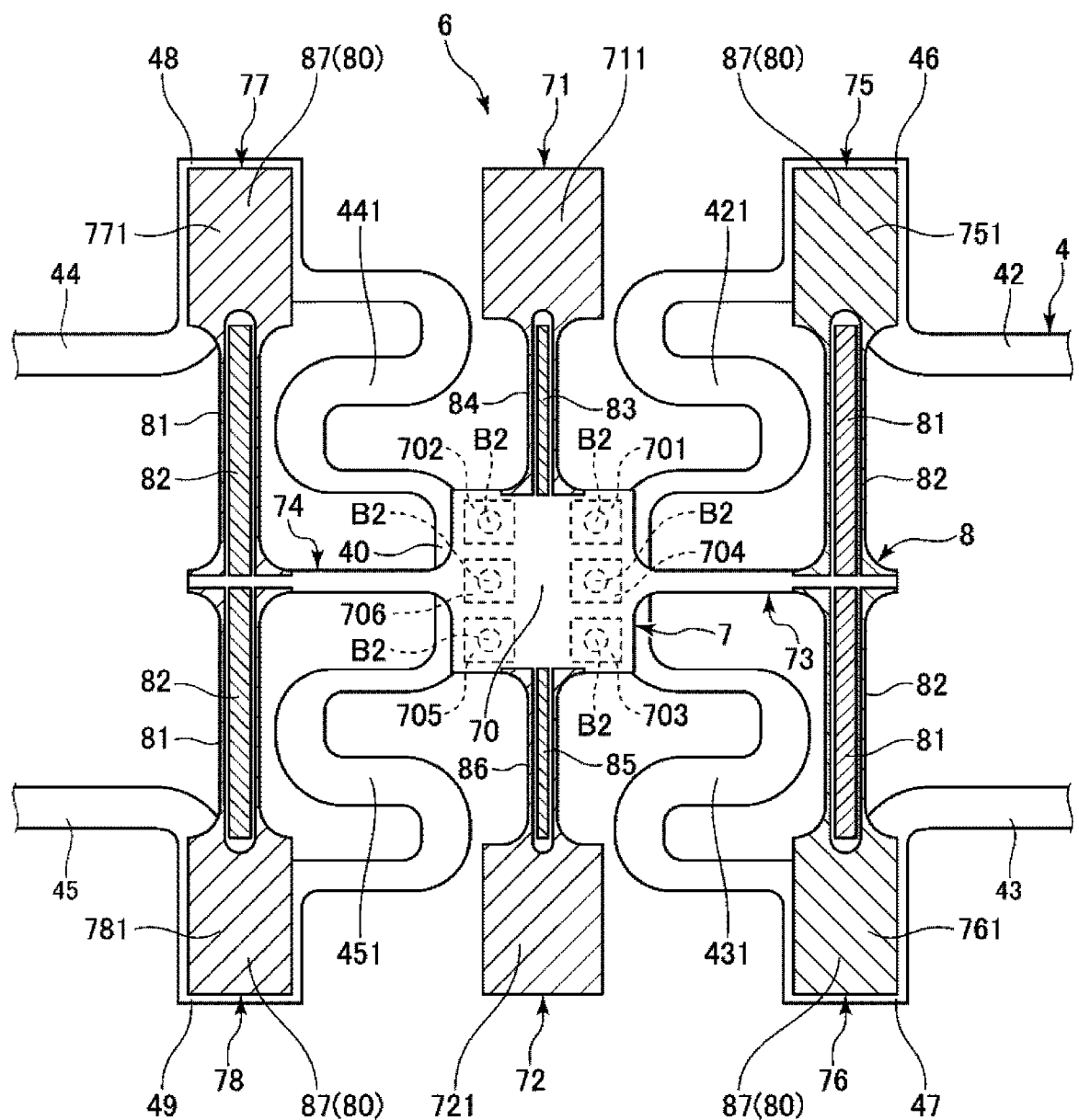
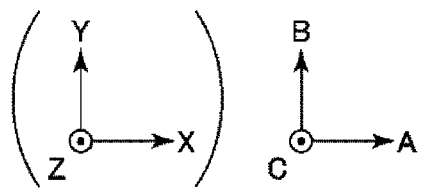

VIBRATOR DEVICE, ELECTRONIC APPARATUS, AND VEHICLE

The present application is based on, and claims priority from JP Application Serial Number 2019-042321, filed Mar. 8, 2019, the disclosure of which is hereby incorporated by reference herein in its entirety.

BACKGROUND

1. Technical Field

The present disclosure relates to a vibrator device, an electronic apparatus, and a vehicle.

2. Related Art

The vibrator device described in JP-A-2016-85179 includes a box-shaped base, a circuit element mounted on the base, an angular velocity sensor element mounted on the circuit element, and a lid that is joined to the base and covers the circuit element and the angular velocity sensor element. The angular velocity sensor element includes a sensor element main body, two support portions that support the sensor element main body on both sides, a pair of beam portions that couple one support portion and the sensor element main body, and a pair of beam portions that couple the other support portion and the sensor element main body. In addition, the angular velocity sensor element is fixed to an upper surface of the circuit element via a conductive joining member in the pair of support portions.

In such a vibrator device, in general, in a state where the circuit element and the angular velocity sensor element are mounted on the base, the angular velocity sensor element is irradiated with laser, a part of an electrode is removed to adjust the mass, and accordingly, the driving frequency is adjusted. However, since the circuit element is positioned immediately below the angular velocity sensor element, there is a concern that the circuit element is irradiated with a laser beam that has passed through an acceleration sensor element, and the circuit element is damaged. Further, it is necessary to provide another member, such as a protective film for protecting the circuit element from the laser beam, and this causes a complicated, large, and high-cost apparatus configuration.

SUMMARY

A vibrator device according to an aspect of the present disclosure includes: abase; a circuit element disposed on the base; a vibrating element disposed to at least partially overlap the circuit element in a plan view; and a support substrate that is disposed between the circuit element and the vibrating element and supports the vibrating element, in which the vibrating element has a frequency adjustment portion that performs frequency adjustment by removing at least a part of the vibrating element, and in which the support substrate includes a base portion that supports the vibrating element, a support portion that supports the base portion, a beam portion that couples the base portion and the support portion, and a shielding portion that is connected to the beam portion, overlaps the frequency adjustment portion in a plan view, and has light shielding properties.

A vibrator device according to another aspect of the present disclosure includes: abase; a circuit element disposed on the base; a vibrating element disposed to at least partially overlap the circuit element in a plan view; and a support substrate that is disposed between the circuit element and the vibrating element and supports the vibrating element, in which the vibrating element has a frequency adjustment portion that performs frequency adjustment by removing at least a part of the vibrating element, and in which the support substrate includes a base portion that supports the vibrating element, a support portion that supports the base portion, a beam portion that couples the base portion and the support portion, and a shielding portion that is connected to the base portion, overlaps the frequency adjustment portion in a plan view, and has light shielding properties.

In the vibrator device, the vibrating element may include a vibration substrate and an electrode disposed on the vibration substrate, and the vibration substrate and the support substrate may be formed of quartz crystals.

In the vibrator device, the vibration substrate and the support substrate may have the same quartz crystal axis direction.

A vibrator device according to another aspect of the present disclosure includes: abase; a circuit element disposed on the base; a vibrating element disposed to at least partially overlap the circuit element in a plan view; and a support substrate that is disposed between the circuit element and the vibrating element and supports the vibrating element, in which the vibrating element has a frequency adjustment portion that performs frequency adjustment by removing at least a part of the vibrating element, and in which the support substrate is formed of quartz crystals and includes a base portion that supports the vibrating element, a support portion that supports the base portion, a beam portion that couples the base portion and the support portion, and a shielding portion that is connected to the support portion, overlaps the frequency adjustment portion in a plan view, and has light shielding properties.

In the vibrator device, a metal film may be disposed on the shielding portion.

The vibrator device may further include a wiring disposed on the support substrate and electrically coupled to the vibrating element, and a thickness of the metal film may be thicker than a thickness of the wiring.

In the vibrator device, the support substrate may be coupled to the base in the support portion.

In the vibrator device, the vibrating element may be a physical quantity sensor element that detects a physical quantity.

An electronic apparatus according to another aspect of the present disclosure includes: the above-described vibrator device; and a signal processing circuit that performs signal processing based on an output signal of the vibrator device.

A vehicle according to another aspect of the present disclosure includes: the above-described vibrator device; and a signal processing circuit that performs signal processing based on an output signal of the vibrator device.

BRIEF DESCRIPTION OF THE DRAWINGS

FIG. 3 is a plan view illustrating a vibrating element included in the vibrator device according to FIG. 1.

DESCRIPTION OF EXEMPLARY EMBODIMENTS

Hereinafter, a vibrator device, an electronic apparatus, and a vehicle of the application example will be described in detail based on embodiments illustrated in the attached drawings.

First Embodiment

Figure 1:
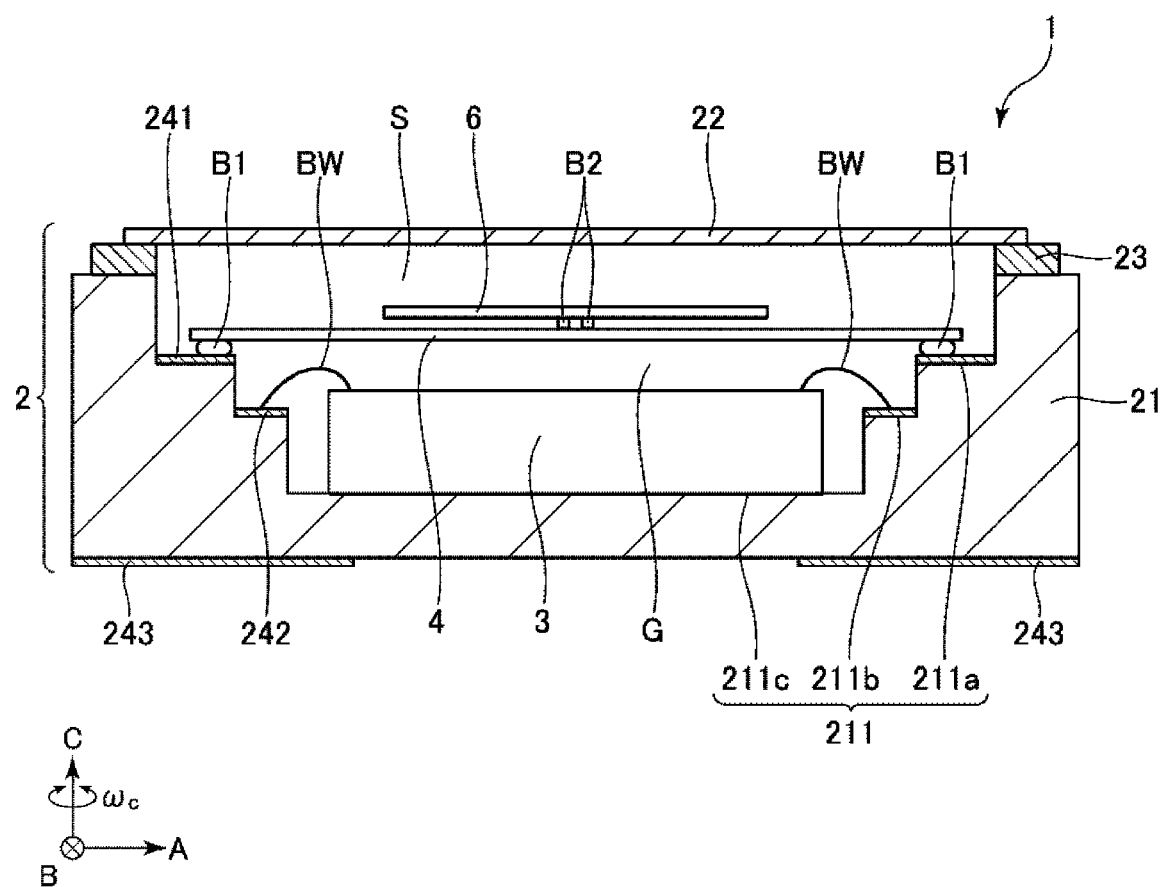
FIG. 1 is a sectional view illustrating a vibrator device according to a first embodiment.
Figure 2:
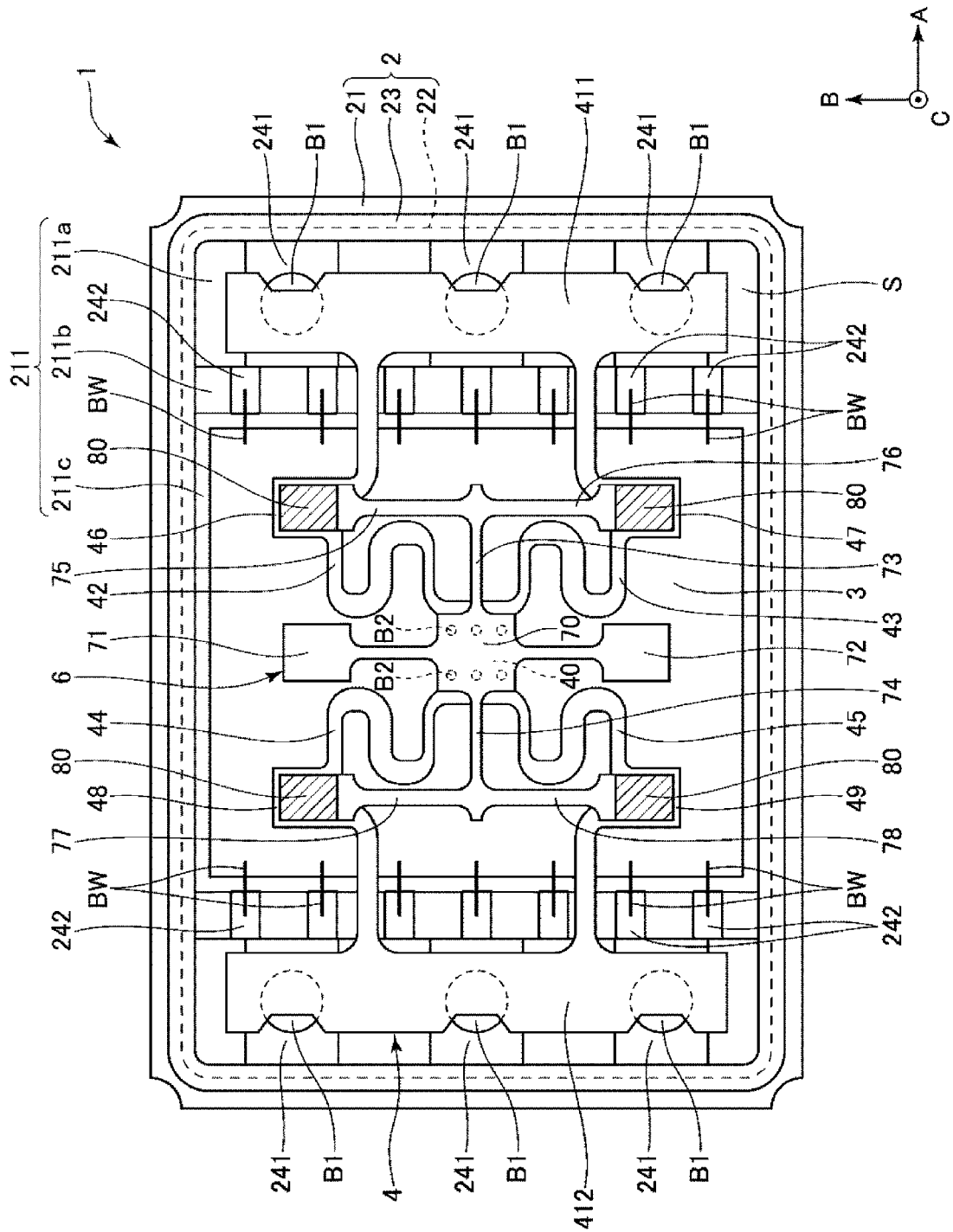
FIG. 2 is a plan view illustrating the vibrator device according to FIG. 1.
Figure 4:
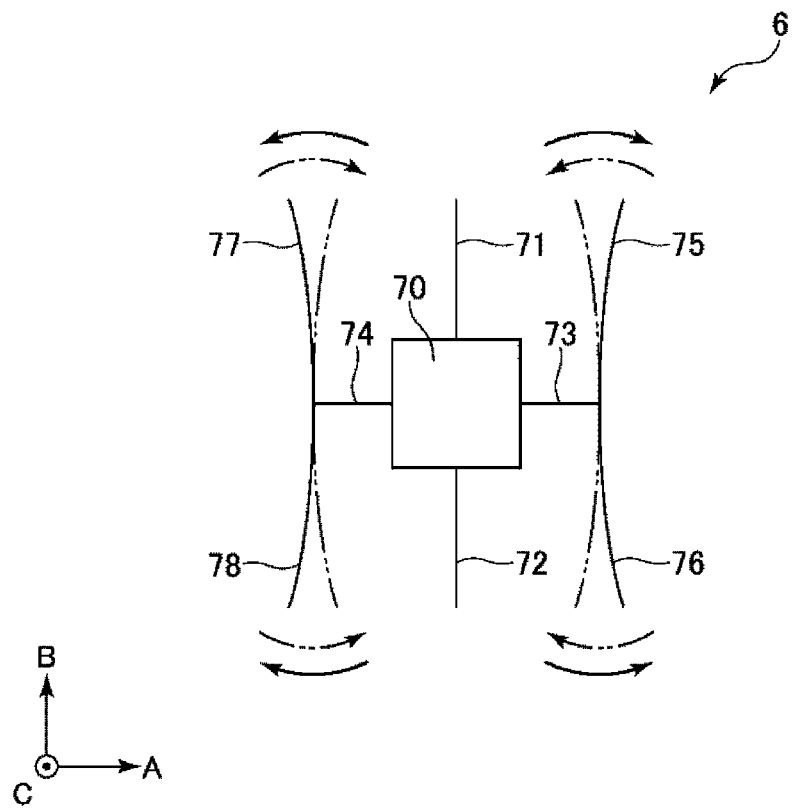
FIG. 4 is a schematic view for describing driving of the vibrating element according to FIG. 3.
Figure 5:
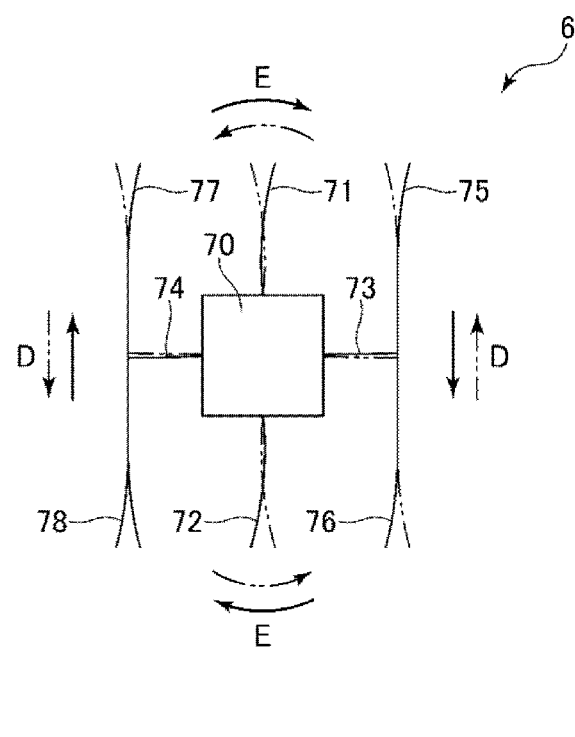
FIG. 5 is a schematic view for describing driving of the vibrating element according to FIG. 3.
Figure 6:
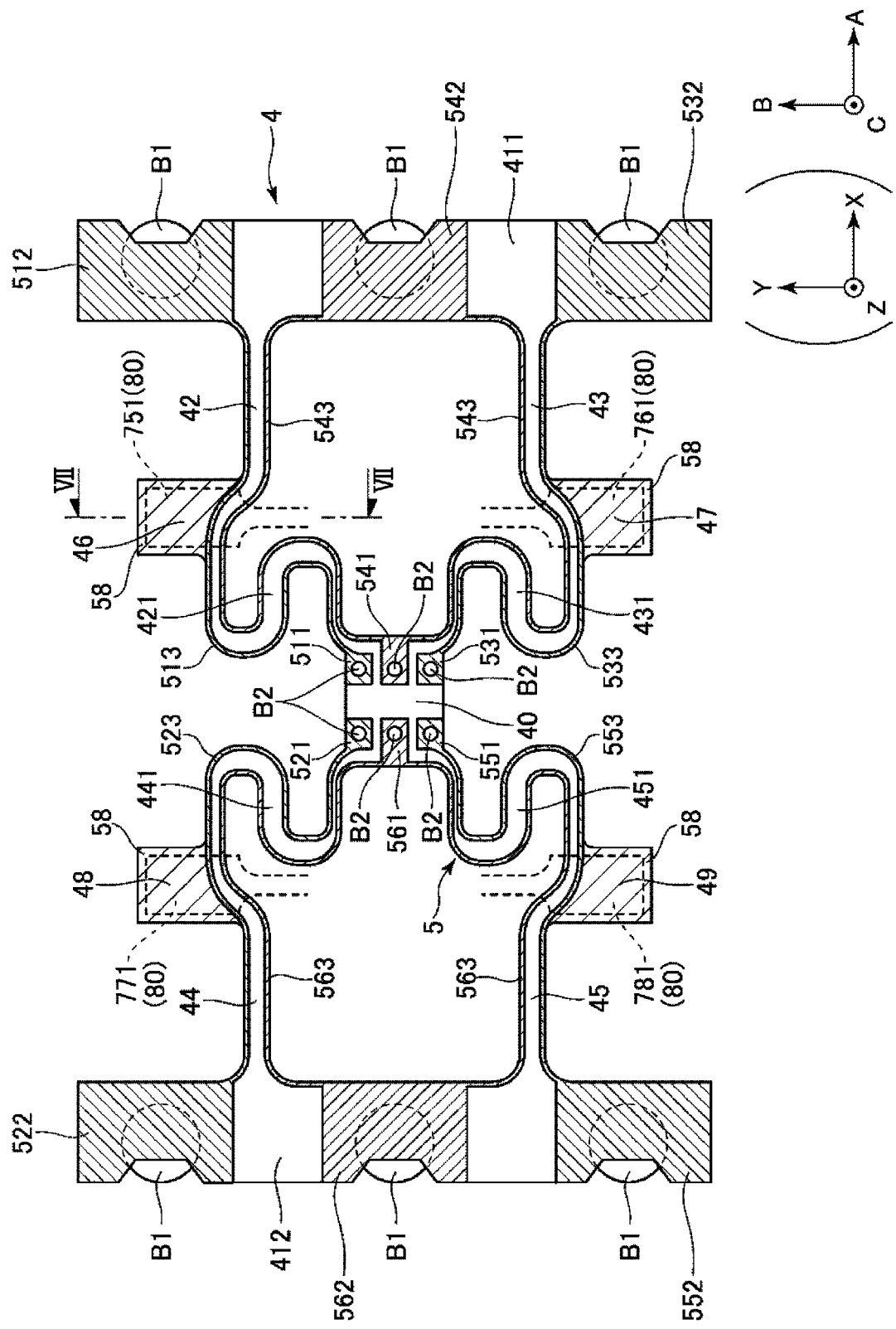
FIG. 6 is a plan view illustrating a support substrate included in the vibrator device illustrated in FIG. 1.
Figure 7:
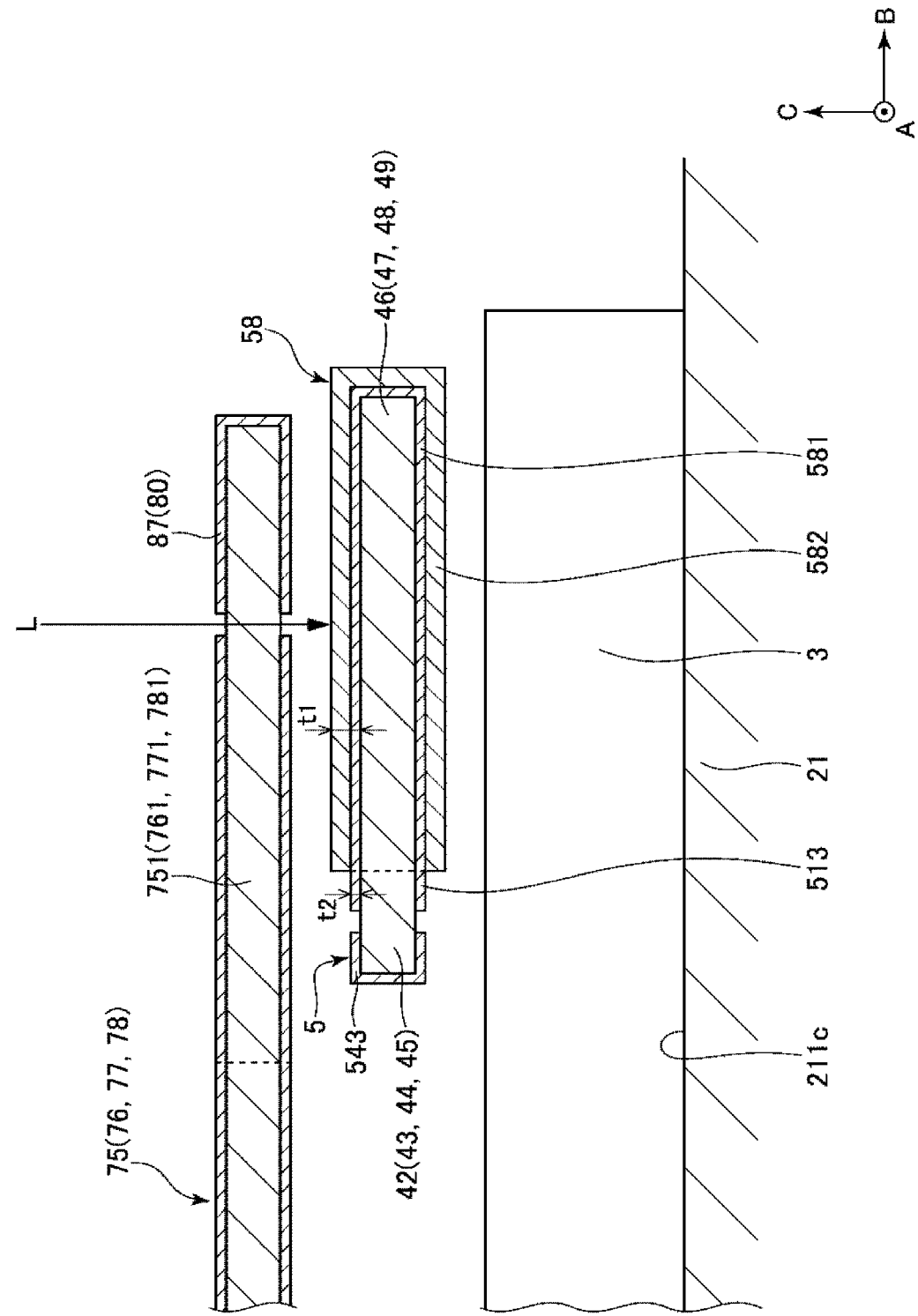
FIG. 7 is a sectional view taken along line VII-VII in FIG. 6.

FIG. 1 is a sectional view illustrating the vibrator device according to a first embodiment. FIG. 2 is a plan view illustrating the vibrator device according to FIG. 1. FIG. 3 is a plan view illustrating the vibrating element included in the vibrator device according to FIG. 1. FIGS. 4 and 5 are schematic views for describing driving of the vibrating element according to FIG. 3. FIG. 6 is a plan view illustrating a support substrate included in the vibrator device illustrated in FIG. 1. FIG. 7 is a sectional view taken along line VII-VII in FIG. 6. For convenience of description, each drawing illustrates an A axis, a B axis, and a C axis that are three axes orthogonal to each other. In the following, the arrow tip end side of each axis is also referred to as "positive side", and the opposite side is also referred to as "negative side". Further, the positive side in the C axis direction is also referred to as "upper", and the negative side is also referred to as "lower". In addition, the plan view from the C axis direction is also simply referred to as "plan view".

A vibrator device 1 illustrated in FIG. 1 is a physical quantity sensor that detects an angular velocity ωc around the C axis. By using the vibrator device 1 as a physical quantity sensor, the vibrator device 1 can be mounted on a wide range of electronic apparatuses, and the vibrator device 1 having high convenience is achieved. The vibrator device 1 includes a package 2, and a circuit element 3, a support substrate 4, and a vibrating element 6 which are accommodated in the package 2.

The package 2 includes a base 21 having a recess portion 211 that is open on the upper surface, and a lid 22 joined to the upper surface of the base 21 via a joining member 23 so as to close an opening of the recess portion 211. An internal space S is formed on the inner side of the package 2 by the recess portion 211, and the circuit element 3, the support substrate 4, and the vibrating element 6 are accommodated in the internal space S. The base 21 can be formed of ceramics, such as alumina, and the lid 22 can be formed of a metal material, such as Kovar. However, the configuration materials of the base 21 and the lid 22 are not particularly limited.

The internal space S is airtight and is in a depressurized state, preferably, a state of being closer to a vacuum. Accordingly, the vibration characteristics of the vibrating element 6 are improved. However, the atmosphere of the internal space S is not particularly limited, and may be, for example, an atmospheric pressure state or a pressurized state.

In addition, the recess portion 211 is configured with a plurality of recess portions, and has a recess portion 211a that is open on the upper surface of the base 21; a recess portion 211b that is open on the bottom surface of the recess portion 211a and has a smaller opening width than that of the recess portion 211a, and a recess portion 211c that is open on the bottom surface of the recess portion 211b and has a smaller opening width than that of the recess portion 211b. The support substrate 4 is fixed to the bottom surface of the recess portion 211a in a state of supporting the vibrating element 6, and the circuit element 3 is fixed to the bottom surface of the recess portion 211c.

In addition, as illustrated in FIG. 2, in the internal space S, the vibrating element 6, the support substrate 4, and the circuit element 3 are disposed to at least partially overlap each other in a plan view. In other words, the vibrating element 6, the support substrate 4, and the circuit element 3 are disposed side by side in the C axis direction. Accordingly, the spread of the package 2 in the A axis direction and the B axis direction can be suppressed, and the size of the vibrator device 1 can be reduced. In addition, the support substrate 4 is positioned between the vibrating element 6 and the circuit element 3 and supports the vibrating element 6 so as to support the vibrating element 6 from the lower side, that is, from the negative side in the C axis direction.

Further, as illustrated in FIGS. 1 and 2, a plurality of internal terminals 241 are disposed on the bottom surface of the recess portion 211a, a plurality of internal terminals 242 are disposed on the bottom surface of the recess portion 211b, and a plurality of external terminals 243 are disposed on the lower surface of the base 21. The internal terminals 241 and 242 and the external terminal 243 are electrically coupled via a wiring (not illustrated) formed in the base 21. Further, the internal terminal 241 is electrically coupled to the vibrating element 6 via conductive joining members B1 and B2 and the support substrate 4, and the internal terminal 242 is electrically coupled to the circuit element 3 via a bonding wire BW.

The vibrating element 6 is an angular velocity sensor element (physical quantity sensor element) capable of detecting the angular velocity ωc around the C axis. As illustrated in FIG. 3, the vibrating element 6 includes a vibration substrate 7 and an electrode 8 disposed on the surface of the vibration substrate 7. The vibration substrate 7 is formed from a Z cut quartz substrate, and includes a base portion 70 positioned at the center portion of the element, detection arms 71 and 72 that extend from the base portion 70 toward both sides in the B axis direction, coupling arms 73 and 74 that extend from the base portion 70 toward both sides in the A axis direction, driving arms 75 and 76 that extend from the tip end portion of the coupling arm 73 toward both sides in the B axis direction, and driving arms 77 and 78 that extend from the tip end portion of the coupling arm 74 toward both sides in the B axis direction. In addition, the Z cut quartz substrate has a width on an X-Y plane defined by the X axis (electrical axis) and the Y axis (mechanical axis) that are quartz crystals axes of the quartz crystals, and has a thickness in the Z axis (optical axis) direction.

Each of the detection arms 71 and 72 has wide portions 711 and 721 that are wider than the part on the base end side at the tip end portions thereof. Each of the driving arms 75, 76, 77, and 78 has wide portions 751, 761, 771, and 781 that are wider than the part on the base end side at the tip end portions thereof.

The electrode 8 includes a drive signal electrode 81, a drive ground electrode 82, a first detection signal electrode 83, a first detection ground electrode 84, a second detection signal electrode 85, a second detection ground electrode 86. The drive signal electrodes 81 are disposed on the upper and lower surfaces of the driving arms 75 and 76 and on both side surfaces of the driving arms 77 and 78. Meanwhile, the drive ground electrodes 82 are disposed on both side surfaces of the driving arms 75 and 76 and on the upper and lower surfaces of the driving arms 77 and 78. The first detection signal electrodes 83 are disposed on the upper and lower surfaces of the detection arm 71, and the first detection ground electrodes 84 are disposed on both side surfaces of the detection arm 71. Meanwhile, the second detection signal electrodes 85 are disposed on the upper and lower surfaces of the detection arm 72, and the second detection ground electrodes 86 are disposed on both side surfaces of the detection arm 72.

Each of the electrodes 81 to 86 is guided to the lower surface of the base portion 70. Therefore, on the lower surface of the base portion 70, a terminal 701 electrically coupled to the drive signal electrode 81, a terminal 702 electrically coupled to the drive ground electrode 82, a terminal 703 electrically coupled to the first detection signal electrode 83, a terminal 704 electrically coupled to the first detection ground electrode 84, a terminal 705 electrically coupled to the second detection signal electrode 85, and a terminal 706 electrically coupled to the second detection ground electrode 86 are disposed.

The vibrating element 6 detects the angular velocity ωc as follows. First, when a drive signal is applied between the drive signal electrode 81 and the drive ground electrode 82, the driving arms 75 to 78 vibrate in a drive vibration mode illustrated in FIG. 4. When the angular velocity ωc is applied to the vibrating element 6 in a state of vibrating in the drive vibration mode, a detection vibration mode illustrated in FIG. 5 is newly excited. In the detection vibration mode, Coriolis force acts on the driving arms 75 to 78 to excite vibrations in the direction indicated by the arrow D, and in response to the vibration, the detection arms 71 and 72 flexurally vibrate in the direction indicated by the arrow E. The charge generated in the detection arm 71 in the detection vibration mode is taken out as a first detection signal from between the first detection signal electrode 83 and the first detection ground electrode 84, the charge generated in the detection arm 72 is taken out as a second detection signal from between the second detection signal electrode 85 and the second detection ground electrode 86, and the angular velocity ωc can be detected based on the first and second detection signals.

As illustrated in FIG. 3, the vibrating element 6 includes a frequency adjustment portion 80 including a metal film 87 disposed in the wide portions 751 to 781 of the driving arms 75 to 78. In the vibrator device 1, before joining the lid 22 to the base 21, the metal film 87 is irradiated with a laser beam from the positive side in the C axis direction to remove at least a part of the metal film 87, and accordingly, the mass of the driving arms 75 to 78 can be reduced, and the vibration balance or driving frequency of the vibrating element 6 can be adjusted. The metal film 87 is formed integrally with the electrode 8.

The configuration of the metal film 87, that is, the electrode 8, is not particularly limited, and for example, an electrode layer formed of Au (gold), Al (aluminum), or an alloy in which Au or Al is considered as a main component can be laminated on a lower base layer formed of Cr (chromium) or Ni (nickel). However, the configuration of the metal film 87 is not limited thereto, and may be a configuration in which another metal film is further laminated on a part integrally formed with the electrode 8, for example. Further, the metal film 87 may be formed separately from the electrode 8. In addition, the frequency adjustment portion 80 may have a film in which the metal film 87 is laminated or a film formed of a material other than metal instead of the metal film 87.

As described above, the circuit element 3 is fixed to the bottom surface of the recess portion 211c. The circuit element 3 includes a drive/detection circuit that drives the vibrating element 6 and detects the angular velocity ωc applied to the vibrating element 6. However, the configuration of the circuit element 3 is not particularly limited, and may include other circuits, such as a temperature compensation circuit, for example.

As illustrated in FIG. 2, the support substrate 4 includes a base portion 40 positioned at the center portion thereof, support portions 411 and 412 that are positioned on both sides of the base portion 40 in the A axis direction and support the base portion 40, a pair of beam portions 42 and 43 that couple the base portion 40 and the support portion 411, a pair of beam portions 44 and 45 that couple the base portion 40 and the support portion 412, and shielding portions 46, 47, 48, and 49 that are disposed in the middle of the beam portions 42, 43, 44, and 45 and have light shielding properties. In addition, the base portion 70 of the vibrating element 6 is fixed to the base portion 40 via the conductive joining member B2, and the support portions 411 and 412 are respectively fixed to the bottom surface of the recess portion 211a via the joining member B1. In other words, the vibrating element 6 is fixed to the base 21 via the support substrate 4. In this manner, by interposing the support substrate 4 between the vibrating element 6 and the base 21, the stress transmitted from the base 21 can be absorbed and alleviated by the support substrate 4, and the stress becomes unlikely to be transmitted to the vibrating element 6. Therefore, it is possible to effectively suppress the deterioration or fluctuation of the vibration characteristics of the vibrating element 6.

In addition, the joining members B1 and B2 are not particularly limited as long as the joining members have both conductivity and joining properties, and for example, various metal bumps, such as gold bumps, silver bumps, copper bumps, and solder bumps, or conductive adhesive in which a conductive filler, such as a silver filler, is dispersed in various adhesives, such as polyimide-based, epoxy-based, silicone-based, and acryl-based adhesives, can be used. When the former metal bumps are used as the joining members B1 and B2, generation of gas from the joining members B1 and B2 can be suppressed, and the environmental change of the internal space S, particularly, an increase in pressure, can be effectively suppressed. Meanwhile, when the latter conductive adhesive is used as the joining members B1 and B2, the joining members B1 and B2 become relatively soft, and the above-described stress can also be absorbed and alleviated in the joining members B1 and B2.

In the embodiment, a conductive adhesive is used as the joining member B1, and metal bumps are used as the joining member B2. By using a conductive adhesive as the joining member B1 that joins the support substrate 4 and the base 21 which are different materials, the thermal stress caused by a difference in thermal expansion coefficient therebetween can be effectively absorbed and alleviated by the joining member B1. Meanwhile, since the support substrate 4 and the vibrating element 6 are joined by six joining members B2 disposed in a relatively narrow region, by using metal bumps as the joining members B2, wetting of the conductive adhesive can be suppressed, and the contact between the joining members B2 can be effectively suppressed.

In particular, as illustrated in FIG. 3, the beam portions 42, 43, 44, and 45 have bent portions 421, 431, 441, and 451 meandering in an S shape in the middle of the beam portions, and have a shape that is easily elastically deformed in the A axis direction and the B axis direction. Therefore, the stress transmitted from the base 21 can be more effectively absorbed and alleviated by the beam portions 42 to 45. However, the shapes of the beam portions 42 to 45 are not particularly limited, and for example, the bent portions 421 to 451 may be omitted to form a straight shape. Further, at least one of the beam portions 42 to 45 may have a different shape from the others.

Such a support substrate 4 is formed of quartz crystals. In other words, the support substrate 4 is formed from a quartz substrate. In this manner, by forming the support substrate 4 from the quartz substrate in the same manner as the vibration substrate 7, the thermal expansion coefficients of the support substrate 4 and the vibration substrate 7 can be made equal. Therefore, the thermal stress caused by the difference in thermal expansion coefficient between the support substrate 4 and the vibration substrate 7 does not substantially occur, and the vibrating element 6 becomes unlikely to receive the stress. Therefore, it is possible to more effectively suppress the deterioration or fluctuation of the vibration characteristics of the vibrating element 6.

In particular, the support substrate 4 is formed from the quartz substrate having the same cut angle as the vibration substrate 7 included in the vibrating element 6. As described above, since the vibration substrate 7 is formed from the Z cut quartz substrate, the support substrate 4 is also formed from the Z cut quartz substrate. Furthermore, the orientation of the quartz crystal axis of the support substrate 4 matches the orientation of the quartz crystal axis of the vibration substrate 7. In other words, the support substrate 4 and the vibration substrate 7 have the same X axis direction, the same Y axis direction, and the same Z axis direction. Since the quartz crystals have different thermal expansion coefficients in each of the X axis direction, the Y axis direction, and the Z axis direction, the support substrate 4 and the vibration substrate 7 have the same cut angle, and by aligning the orientations of the quartz crystals axes with each other, the above-described thermal stress becomes unlikely to occur between the support substrate 4 and the vibration substrate 7. Therefore, the vibrating element 6 becomes unlikely to receive stress, and the deterioration or fluctuation of the vibration characteristics can be further effectively suppressed.

The support substrate 4 is not limited thereto, and for example, the support substrate 4 has the same cut angle as the vibration substrate 7, but the quartz crystal axis direction may be different from that of the vibration substrate 7. Further, the support substrate 4 maybe formed from a quartz substrate having a cut angle different from that of the vibration substrate 7. Further, the support substrate 4 may not be formed from a quartz substrate. In this case, the configuration material of the support substrate 4 is preferably a material in which the difference in thermal expansion coefficient between the quartz crystals and the configuration material of the support substrate 4 is smaller than the difference in thermal expansion coefficient between the quartz crystals and the configuration material of the base 21.

In addition, a wiring 5 that electrically couples the vibrating element 6 and the internal terminal 241 is disposed on the support substrate 4. As illustrated in FIG. 6, the wiring 5 includes terminals 511, 521, 531, 541, 551, and 561 disposed on the base portion 40, terminals 512, 532, and 542 disposed on the support portion 411, and terminals 522, 552, and 562 disposed on the support portion 412. Further, the wiring 5 includes a lead wiring 513 that couples the terminal 511 and the terminal 512 passing through the beam portion 42, a lead wiring 523 that couples the terminal 521 and the terminal 522 passing through the beam portion 44, a lead wiring 533 that couples the terminal 531 and the terminal 532 passing through the beam portion 43, a lead wiring 543 that couples the terminal 541 and the terminal 542 passing through the beam portions 42 and 43, a lead wiring 553 that couples the terminal 551 and the terminal 552 passing through the beam portion 45, and a lead wiring 563 that couples the terminal 561 and the terminal 562 passing through the beam portions 44 and 45.

Although not illustrated, the terminals 511 to 561 disposed on the base portion 40 are electrically coupled to the terminals 701 to 706 disposed on the base portion 70 of the vibrating element 6 via the conductive joining member B2, and the terminals 512 to 562 disposed on the support portions 411 and 412 are electrically coupled to the internal terminal 241 via the conductive joining member Bl. Accordingly, the vibrating element 6 and the internal terminal 241 are electrically coupled via the wiring 5.

Further, in a plan view, the shielding portion 46 disposed in the middle of the beam portion 42 is disposed to overlap the wide portion 751 of the driving arm 75, the shielding portion 47 disposed in the middle of the beam portion 43 is disposed to overlap the wide portion 761 of the driving arm 76, the shielding portion 48 disposed in the middle of the beam portion 44 is disposed to overlap the wide portion 771 of the driving arm 77, and the shielding portion 49 disposed in the middle of the beam portion 45 is disposed so as to overlap the wide portion 781 of the driving arm 78. In other words, the shielding portion 46 is positioned between the wide portion 751 and the circuit element 3, the shielding portion 47 is positioned between the wide portion 761 and the circuit element 3, the shielding portion 48 is positioned between the wide portion 771 and the circuit element 3, and the shielding portion 49 is positioned between the wide portion 781 and the circuit element 3.

In addition, a metal film 58 is disposed on each of the shielding portions 46, 47, 48, and 49. Therefore, each of the shielding portions 46, 47, 48, and 49 can exhibit the light-shielding properties that prevent transmission of a laser beam. According to the shielding portions 46, 47, 48, and 49, as illustrated in FIG. 7, when a laser beam L used for adjusting the driving frequency of the vibrating element 6 is transmitted through the vibrating element 6, the transmitted laser beam L can be cut off before the circuit element 3. Therefore, irradiation of the circuit element 3 with the laser beam L is suppressed, and damage to the circuit element 3 due to the laser beam L can be effectively suppressed.

In addition, the light shielding properties of the shielding portions 46, 47, 48, and 49 are not particularly limited as long as transmission of at least a part of the laser beam L can be prevented, but it is preferable that 50% or more of the laser beam L can be shielded, more preferable that 80% or more can be shielded, and still more preferable that 95% or more can be shielded. Accordingly, damage to the circuit element 3 as described above can be more effectively suppressed.

Here, as described above, since the support substrate 4 is fixed to the base 21, a gap G between the vibrating element 6 and the circuit element 3 can be secured relatively wide. Therefore, even when the laser beam L that has passed through the vibrating element 6 is further transmitted through the shielding portions 46, 47, 48, and 49 and is applied to the circuit element 3, the laser beam L is sufficiently diffused on the circuit element 3, and local application of high energy can be suppressed. Therefore, damage to the circuit element 3 can be more effectively suppressed. However, not being limited thereto, for example, the support substrate 4 may be fixed to the upper surface of the circuit element 3 in the support portions 411 and 412.

Further, as illustrated in FIG. 7, the metal film 58 disposed in each of the shielding portions 46, 47, 48, and 49 has a first part 581 integrally formed with the wiring 5, and a second part 582 laminated on the first part 581. Therefore, a thickness t1 of the metal film 58 is greater than a thickness t2 of the wiring 5. In other words, t1>t2. With such a configuration, the metal film 58 can be made sufficiently thick, and the light shielding properties of the laser beam L can be improved. Further, since the first part 581 is shared with the wiring 5, the metal film 58 can be easily formed.

The configuration of the first part 581, that is, the wiring 5, is not particularly limited, but for example, an electrode layer formed of Au (gold), Al (aluminum), or an alloy in which Au or Al is considered as a main component can be laminated on a lower base layer formed of Cr (chromium) or Ni (nickel). Further, the second part 582 is not particularly limited, but for example, may be formed of the same material as the electrode layer. In the present embodiment, the first part 581 is linked to the wiring 5, but not being limited thereto, the first part 581 may be separated from the wiring 5.

The thickness t1 of the metal film 58 is not particularly limited, but is preferably $1.2 \leq t1/t2 \leq 5.0$, more preferably $1.5 \leq t1/t2 \leq 3.0$, and further more preferably $2.0 \leq t1/t2 \leq 2.5$. Accordingly, the shielding portions 46, 47, 48, and 49 having excellent light shielding properties can be obtained while suppressing the excessive thickening of the metal film 58.

Above, the vibrator device 1 has been described. As described above, the vibrator device 1 includes the base 21, the circuit element 3 disposed on the base 21, the vibrating element 6 disposed to at least partially overlap the circuit element 3 in a plan view, and the support substrate 4 that is disposed between the circuit element 3 and the vibrating element 6 and supports the vibrating element 6. In addition, the vibrating element 6 includes the frequency adjustment portion 80 that performs frequency adjustment by removing at least a part of the vibrating element 6. The support substrate 4 includes the base portion 40 that supports the vibrating element 6, the support portions 411 and 412 that support the base portion 40, the beam portions 42, 43, 44, and 45 that couple the base portion 40 and the support portions 411 and 412, and the shielding portions 46, 47, 48, and 49 that are connected to the beam portions 42, 43, 44, and 45, overlap the frequency adjustment portion 80 in a plan view, and have light shielding properties. Accordingly, when the laser beam L used for frequency adjustment of the vibrating element 6 passes through the vibrating element 6, the transmitted laser beam L can be cut off by the shielding portions 46, 47, 48, and 49 before the circuit element 3. Therefore, the circuit element 3 is not irradiated with the laser beam L, and damage to the circuit element 3 due to the laser beam L can be effectively suppressed.

As described above, the vibrating element 6 includes the vibration substrate 7 and the electrode 8 disposed on the vibration substrate 7. The vibration substrate 7 and the support substrate 4 are formed of quartz crystals. In this manner, by forming the support substrate 4 from the quartz crystals in the same manner as the vibration substrate 7, the thermal expansion coefficients of the support substrate 4 and the vibration substrate 7 can be made equal. Therefore, the thermal stress caused by the difference in thermal expansion coefficient between the support substrate 4 and the vibration substrate 7 does not substantially occur, and the vibrating element 6 becomes unlikely to receive the stress. Therefore, it is possible to more effectively suppress the deterioration or fluctuation of the vibration characteristics of the vibrating element 6.

Further, as described above, the vibration substrate 7 and the support substrate 4 have the same quartz crystal axis direction. In other words, the support substrate 4 and the vibration substrate 7 have the same X axis direction, the same Y axis direction, and the same Z axis direction. Since the quartz crystals have different thermal expansion coefficients in each of the X axis direction, the Y axis direction, and the Z axis direction, by aligning the quartz crystals axes of the support substrate 4 and the vibration substrate 7, the above-described thermal stress becomes unlikely to occur between the substrate 4 and the vibration substrate 7. Therefore, the vibrating element 6 becomes unlikely to receive stress, and the deterioration or fluctuation of the vibration characteristics can be further effectively suppressed.

As described above, the metal film 58 is disposed on each of the shielding portions 46, 47, 48, and 49. Accordingly, while the configuration of the shielding portions 46, 47, 48, and 49 becomes simple, excellent light shielding properties can be exhibited.

Further, as described above, the vibrator device 1 includes the wiring 5 disposed on the support substrate 4 and electrically coupled to the vibrating element 6. In addition, the thickness t1 of the metal film 58 is greater than the thickness t2 of the wiring 5. Accordingly, the metal film 58 can be made sufficiently thick, and the light shielding properties of the laser beam L can be improved.

Further, as described above, the support substrate 4 is coupled to the base 21 at the support portions 411 and 412. Accordingly, the support substrate 4 can be fixed in a stable posture. Furthermore, since the gap G between the vibrating element 6 and the circuit element 3 can be secured wide, even when the laser beam L that has passed through the vibrating element 6 is further transmitted through the shielding portions 46, 47, 48, and 49 and is applied to the circuit element 3, the laser beam L is sufficiently diffused on the circuit element 3, and local application of high energy can be suppressed. Therefore, damage to the circuit element 3 can be more effectively suppressed.

Further, as described above, the vibrating element 6 is a physical quantity sensor element that detects a physical quantity. In particular, in the present embodiment, the vibrating element 6 is an angular velocity sensor element that detects the angular velocity $\omega c$. Accordingly, the vibrator device 1 can be mounted on a wide range of electronic apparatuses, and the vibrator device 1 having highly convenience is achieved.

Second Embodiment

Figure 8:
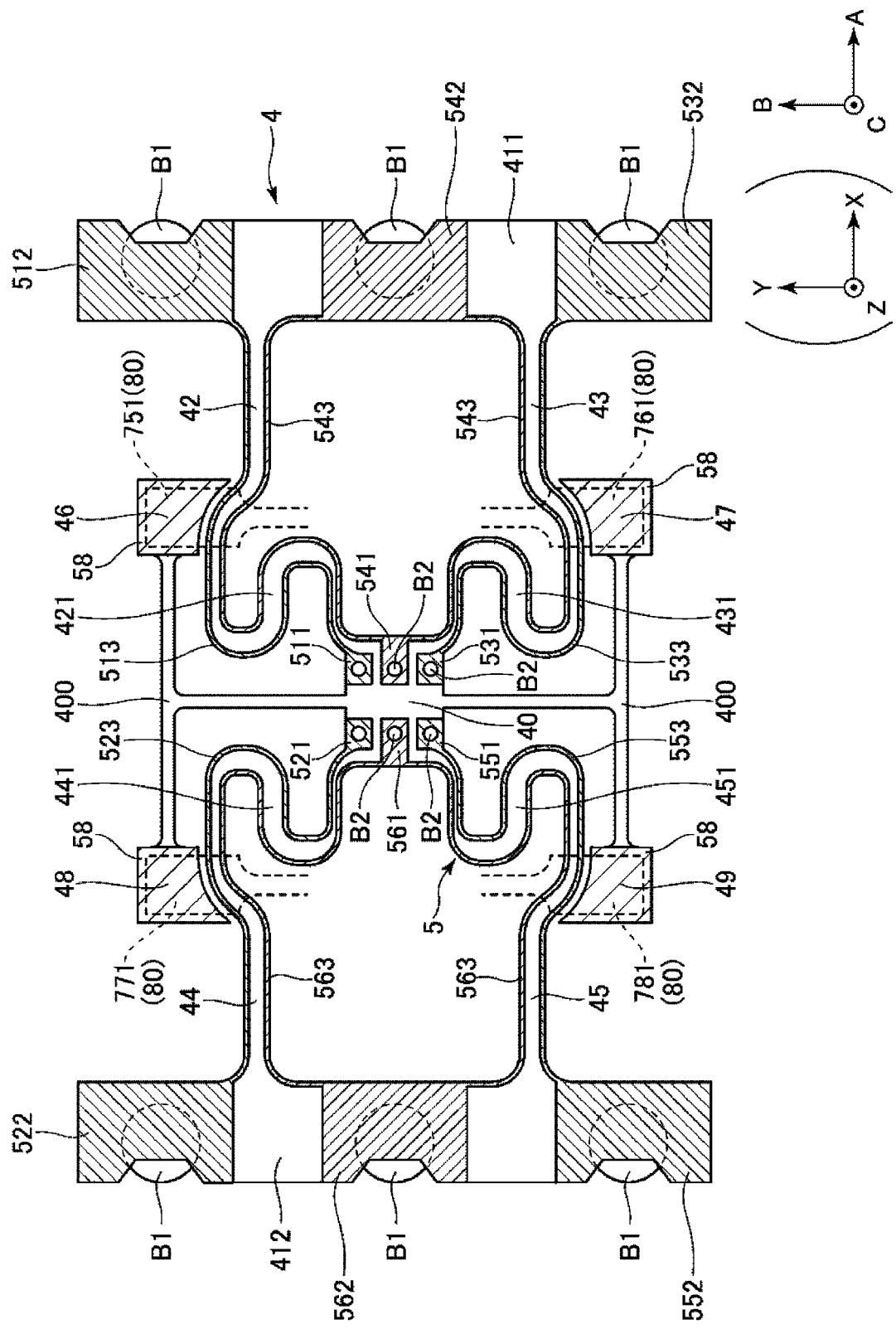
FIG. 8 is a plan view illustrating a support substrate included in a vibrator device according to a second embodiment.

FIG. 8 is a plan view illustrating the support substrate included in the vibrator device according to a second embodiment.

The embodiment is similar to the above-described first embodiment except for the configuration of the support substrate 4. In the following description regarding the embodiment, the differences from the above-described embodiment will be mainly described, and the description of similar contents will be omitted. In addition, in FIG. 8, the same configurations will be given the same reference numerals as those in the above-described embodiment.

As illustrated in FIG. 8, in the support substrate 4 of the embodiment, the shielding portions 46 to 49 are connected to the base portion 40, respectively. Specifically, the shielding portions 46 to 49 are respectively coupled to the base portion 40 via a coupling portion 400. According to such a configuration, the shielding portions 46 to 49 may not be connected to the beam portions 42 to 45. Therefore, the beam portions 42 to 45 are softened and are more easily elastically deformed. Accordingly, thermal stress can be more effectively absorbed and alleviated by the beam portions 42 to 45.

As described above, the vibrator device 1 according to the embodiment includes the base 21, the circuit element 3 disposed on the base 21, the vibrating element 6 disposed to at least partially overlap the circuit element 3 in a plan view, and the support substrate 4 that is disposed between the circuit element 3 and the vibrating element 6 and supports the vibrating element 6. In addition, the vibrating element 6 includes the frequency adjustment portion 80 that performs frequency adjustment by removing at least a part of the vibrating element 6. The support substrate 4 includes the base portion 40 that supports the vibrating element 6, the support portions 411 and 412 that support the base portion 40, the beam portions 42, 43, 44, and 45 that couple the base portion 40 and the support portions 411 and 412, and the shielding portions 46, 47, 48, and 49 that are connected to the base portion 40, overlap the frequency adjustment portion 80 in a plan view, and have light shielding properties. Accordingly, when the laser beam L used for frequency adjustment of the vibrating element 6 passes through the vibrating element 6, the transmitted laser beam L can be cut off by the shielding portions 46, 47, 48, and 49 before the circuit element 3. Therefore, the circuit element 3 is not irradiated with the laser beam L, and damage to the circuit element 3 due to the laser beam L can be effectively suppressed.

Third Embodiment

Figure 9:
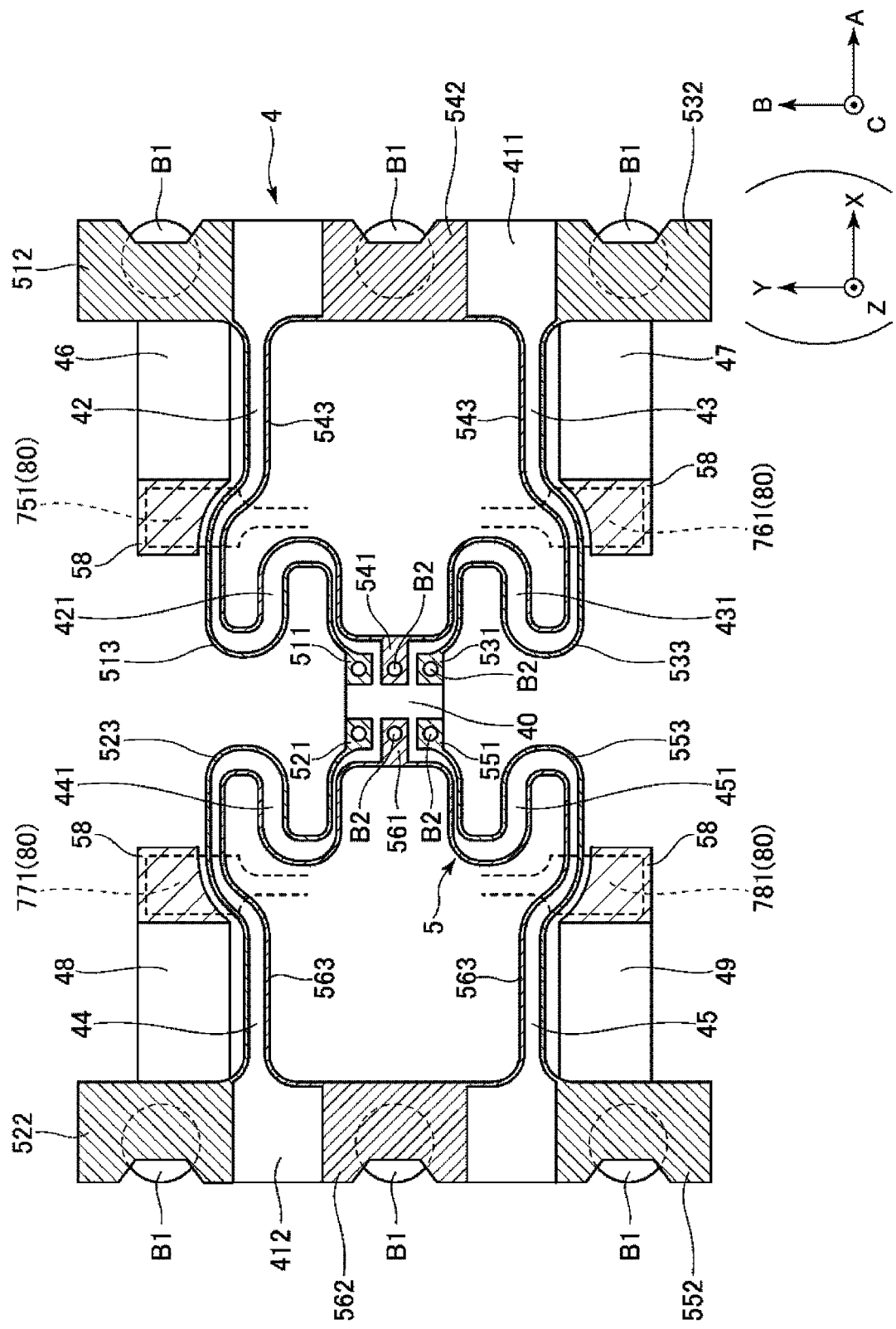
FIG. 9 is a plan view illustrating a support substrate included in a vibrator device according to a third embodiment.

FIG. 9 is a plan view illustrating the support substrate included in the vibrator device according to a third embodiment.

The embodiment is similar to the above-described first embodiment except for the configuration of the support substrate 4. In the following description regarding the embodiment, the differences from the above-described embodiment will be mainly described, and the description of similar contents will be omitted. In addition, in FIG. 9, the same configurations will be given the same reference numerals as those in the above-described embodiment.

As illustrated in FIG. 9, the support substrate 4 of the embodiment is formed of quartz crystals in the same manner as the above-described first embodiment. However, unlike the first embodiment, the shielding portions 46 and 47 are connected to the support portion 411, and the shielding portions 48 and 49 are connected to the support portion 412. Specifically, the shielding portions 46 and 47 are respectively disposed to protrude from the support portion 411 toward the negative side in the A axis direction, and the shielding portions 48 and 49 are respectively disposed to protrude from the support portion 412 toward the positive side in the A axis direction.

By disposing the shielding portions 46 to 49 on the support portions 411 and 412, for example, the postures of the shielding portions 46 to 49 are stabilized compared to the above-described first embodiment. In other words, the beam portions 42 to 45 are easily deformed by thermal stress or impact, and there is a concern that the posture or position of the shielding portions 46 to 49 changes due to the deformation. On the other hand, since the support portions 411 and 412 are parts fixed to the base 21, the postures thereof are stable. Therefore, by disposing the shielding portions 46 to 49 on the support portions 411 and 412, the postures of the shielding portions 46 to 49 are stabilized, and the effects of the shielding portions 46 to 49 can be more reliably exhibited. Furthermore, since the shielding portions 46 to 49 are not connected to the beam portions 42 to 45, the beam portions 42 to 45 are softened and are easily elastically deformed. Therefore, thermal stress can be more effectively absorbed and alleviated.

As described above, the vibrator device 1 according to the embodiment includes the base 21, the circuit element 3 disposed on the base 21, the vibrating element 6 disposed to at least partially overlap the circuit element 3 in a plan view, and the support substrate 4 that is disposed between the circuit element 3 and the vibrating element 6 and supports the vibrating element 6. In addition, the vibrating element 6 includes the frequency adjustment portion 80 that performs frequency adjustment by removing at least a part of the vibrating element 6. The support substrate 4 is formed of quartz crystals and includes the base portion 40 that supports the vibrating element 6, the support portions 411 and 412 that support the base portion 40, the beam portions 42 to 45 that couple the base portion 40 and the support portions 411 and 412, and the shielding portions 46 to 49 that are connected to the support portions 411 and 412, overlap the frequency adjustment portion 80 in a plan view, and have light shielding properties. Accordingly, when the laser beam L used for frequency adjustment of the vibrating element 6 passes through the vibrating element 6, the transmitted laser beam L can be cut off by the shielding portions 46, 47, 48, and 49 before the circuit element 3. Therefore, the circuit element 3 is not irradiated with the laser beam L, and damage to the circuit element 3 due to the laser beam L can be effectively suppressed.

Fourth Embodiment

Figure 10:
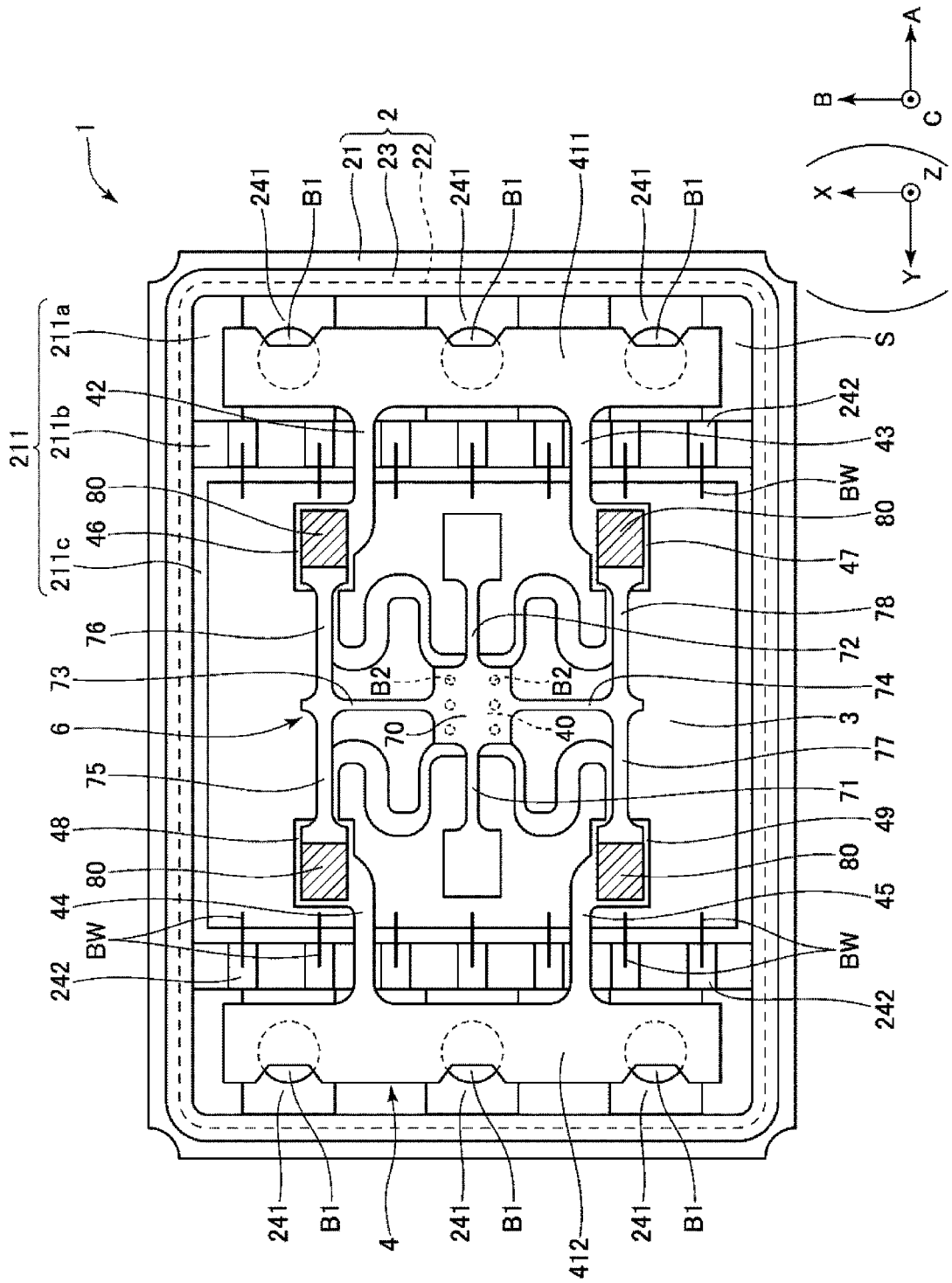
FIG. 10 is a plan view illustrating a vibrator device according to a fourth embodiment.

FIG. 10 is a plan view illustrating the vibrator device according to a fourth embodiment.

The embodiment is similar to the above-described first embodiment except for the orientation of the vibrating element 6. In the following description regarding the embodiment, the differences from the above-described embodiment will be mainly described, and the description of similar contents will be omitted. In addition, in FIG. 10, the same configurations will be given the same reference numerals as those in the above-described embodiment.

As illustrated in FIG. 10, in the vibrator device 1 of the embodiment, the vibrating element 6 is disposed in a posture rotated by 90° around the C axis with respect to the above-described first embodiment. In accordance with this, the quartz crystal axis of the support substrate 4 is also rotated by 90° around the C axis, and the vibration substrate 7 and the support substrate 4 have the same quartz crystal axis direction. According to such a configuration, the same effects as those of the above-described first embodiment can be exhibited.

Fifth Embodiment

Figure 11:
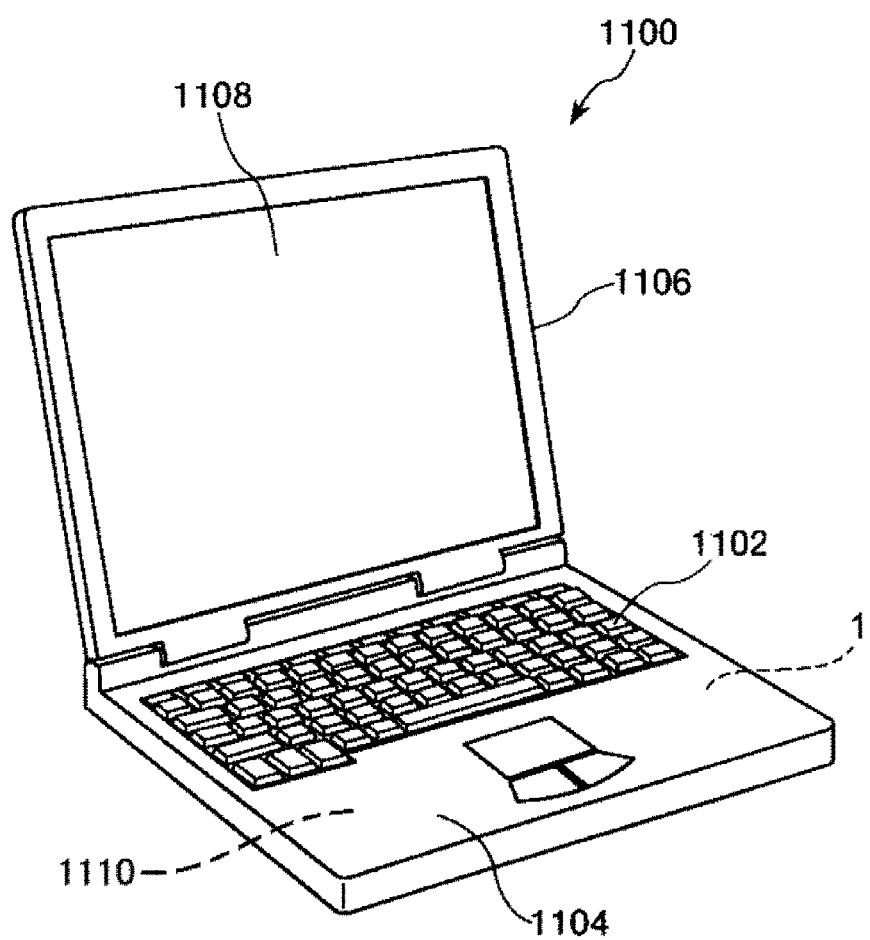
FIG. 11 is a perspective view illustrating a personal computer according to a fifth embodiment.

FIG. 11 is a perspective view illustrating a personal computer according to a fifth embodiment.

A personal computer 1100 as an electronic apparatus illustrated in FIG. 11 includes a main body portion 1104 provided with a keyboard 1102 and a display unit 1106 provided with a display portion 1108, and the display unit 1106 is supported to be rotatable through a hinge structure with respect to the main body portion 1104. In addition, the personal computer 1100 includes the vibrator device 1 as a physical quantity sensor and a signal processing circuit 1110 that performs signal processing, that is, controls each portion, based on an output signal from the vibrator device 1.

As described above, the personal computer 1100 as the electronic apparatus includes the vibrator device 1 and the signal processing circuit 1110 that performs signal processing based on the output signal of the vibrator device 1. Therefore, the effect of the above-described vibrator device 1 can be enjoyed and high reliability can be exhibited.

Sixth Embodiment

Figure 12:
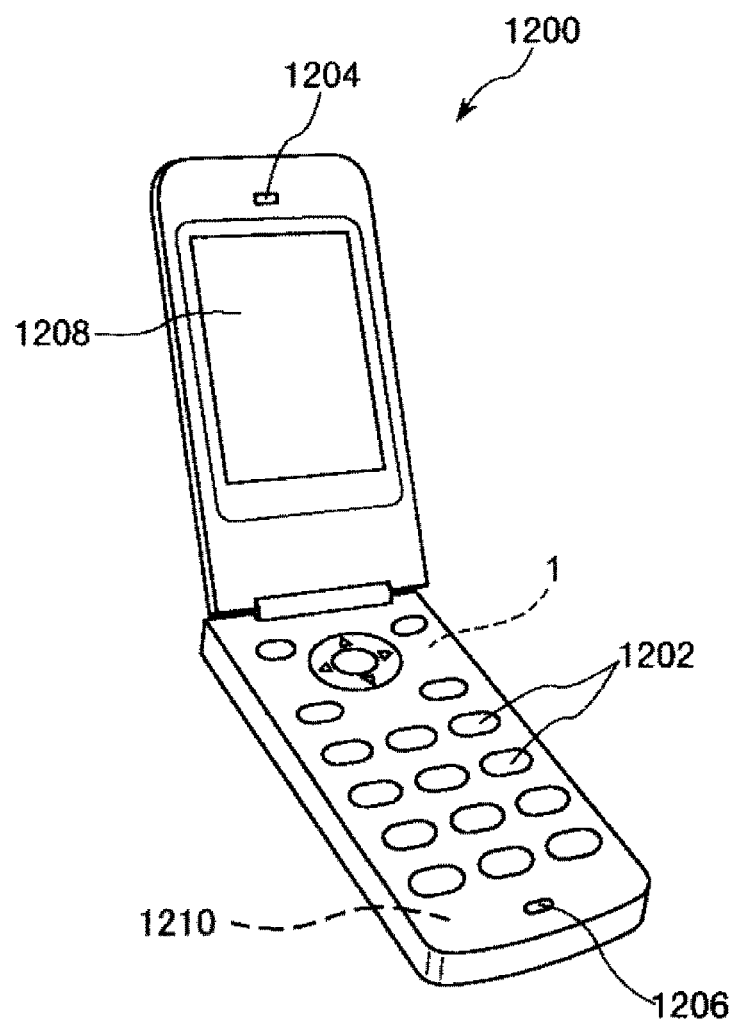
FIG. 12 is a perspective view illustrating a mobile phone according to a sixth embodiment.

FIG. 12 is a perspective view illustrating a mobile phone according to a sixth embodiment.

A mobile phone 1200 as an electronic apparatus illustrated in FIG. 12 includes an antenna (not illustrated), a plurality of operation buttons 1202, an earpiece 1204, and a mouthpiece 1206, and a display portion 1208 is disposed between the operation buttons 1202 and the earpiece 1204. In addition, the mobile phone 1200 includes the vibrator device 1 as a physical quantity sensor and a signal processing circuit 1210 that performs signal processing, that is, controls each portion, based on an output signal from the vibrator device 1.

In this manner, the mobile phone 1200 as the electronic apparatus includes the vibrator device 1 and the signal processing circuit 1210 that performs signal processing based on the output signal of the vibrator device 1. Therefore, the effect of the above-described vibrator device 1 can be enjoyed and high reliability can be exhibited.

Seventh Embodiment

Figure 13:
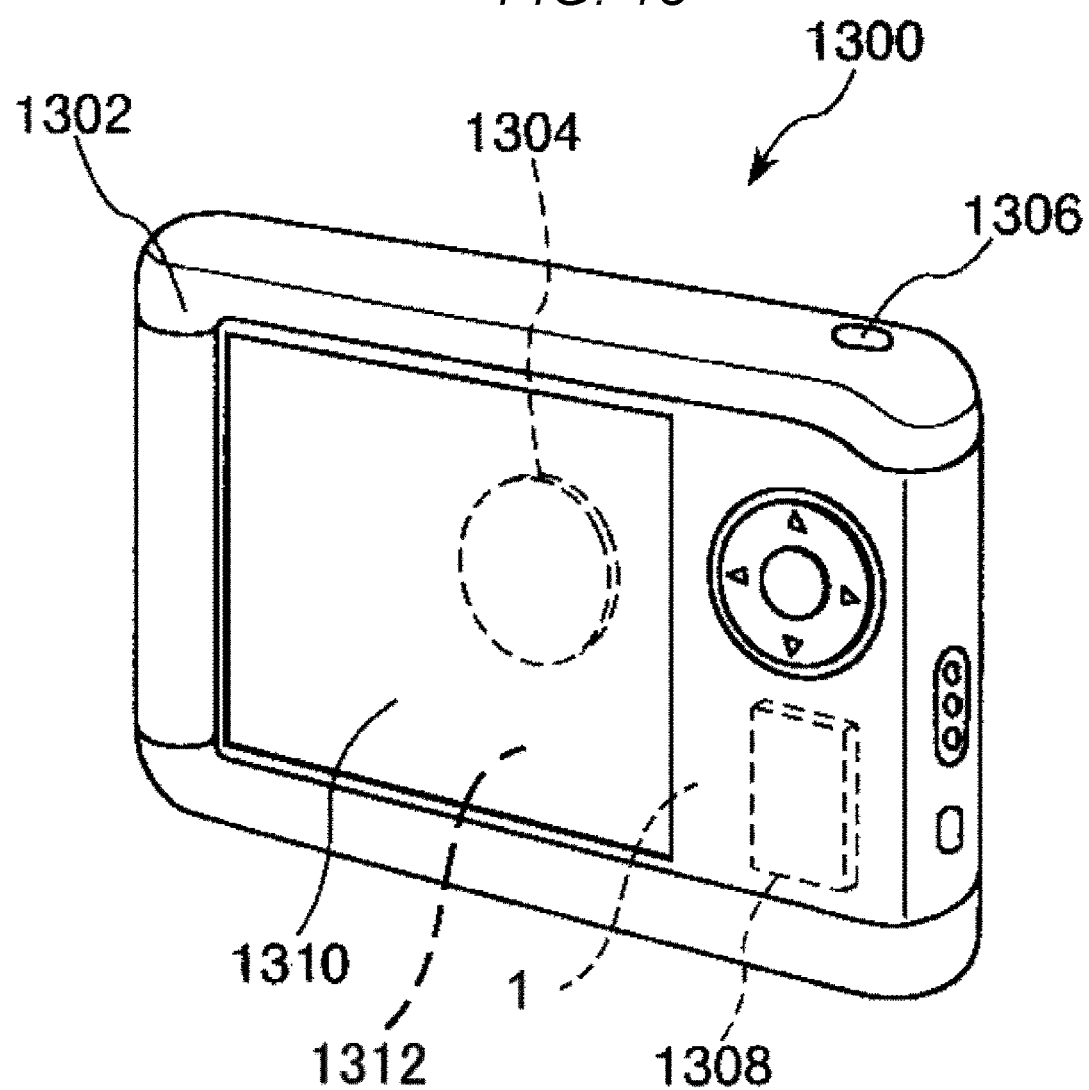
FIG. 13 is a perspective view illustrating a digital still camera according to a seventh embodiment.

FIG. 13 is a perspective view illustrating a digital still camera according to a seventh embodiment.

A digital still camera 1300 as an electronic apparatus illustrated in FIG. 13 includes a case 1302, and a display portion 1310 is provided on the back surface of the case 1302. The display portion 1310 is configured to perform display based on an imaging signal from a CCD, and functions as a finder that displays a subject as an electronic image. In addition, a light receiving unit 1304 including an optical lens or a CCD is provided on the front side of the case 1302. When a photographer confirms a subject image displayed on the display portion 1310 and presses a shutter button 1306, the imaging signal of the CCD at this time is transferred and stored in a memory 1308. In addition, the digital still camera 1300 includes the vibrator device 1 as a physical quantity sensor and a signal processing circuit 1312 that performs signal processing, that is, controls each portion, based on an output signal from the vibrator device 1.

In this manner, the digital still camera 1300 as the electronic apparatus includes the vibrator device 1 and the signal processing circuit 1312 that performs signal processing based on the output signal of the vibrator device 1. Therefore, the effect of the above-described vibrator device 1 can be enjoyed and high reliability can be exhibited.

In addition to the above-described personal computer 1100, the mobile phone 1200, and the digital still camera 1300, examples of the electronic apparatus including the vibrator device 1 may include smartphones, tablet terminals, timepieces including a smart watch, ink jet discharge devices, such as an ink jet printer, wearable terminals, such as a head-mounted display (HMD), TV, video cameras, video tape recorders, car navigation devices, pagers, electronic notebooks having communication functions, electronic dictionaries, calculators, electronic game machines, word processors, workstations, videophones, security video monitors, electronic binoculars, POS terminals, electronic thermometers, sphygmomanometers, blood glucose meters, electrocardiogram measuring devices, ultrasound diagnostic devices, medical devices, such as an electronic endoscope, fish finders, various measurement devices, instruments for vehicles, aircrafts, ships and the like, base stations for a mobile terminal, flight simulators, and the like.

Eighth Embodiment

Figure 14:
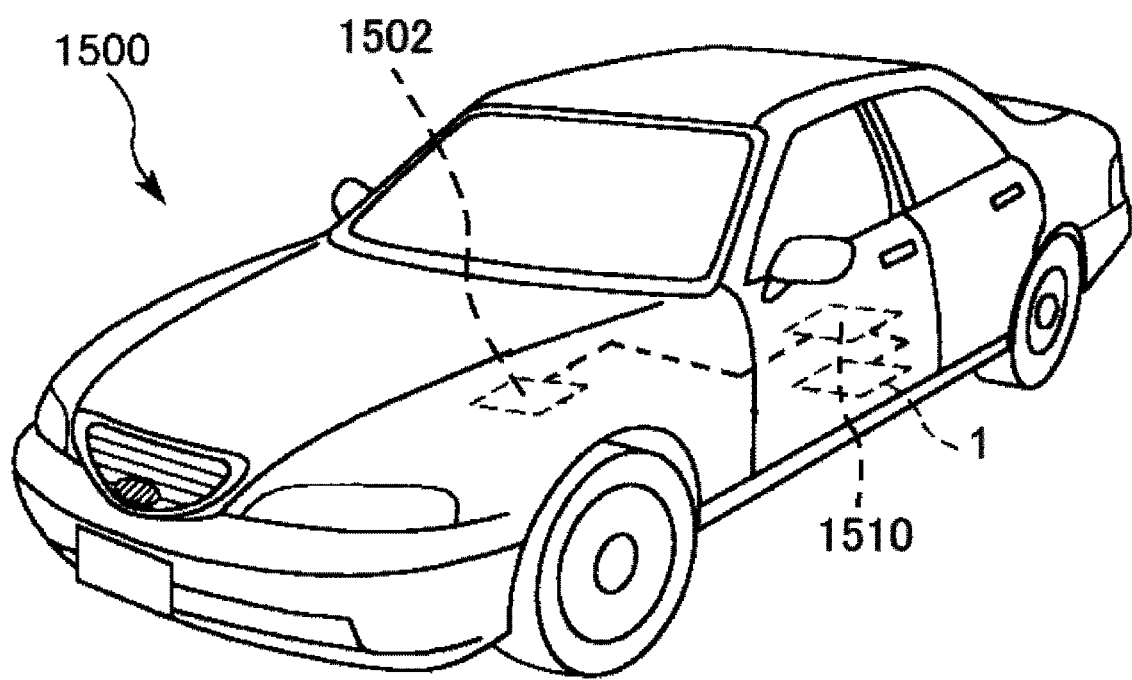
FIG. 14 is a perspective view illustrating an automobile according to an eighth embodiment.

FIG. 14 is a perspective view illustrating an automobile according to an eighth embodiment.

An automobile 1500 as a vehicle illustrated in FIG. 14 includes a system 1502, such as an engine system, a brake system, and a keyless entry system. In addition, the automobile 1500 includes a vibrator device 1 as a physical quantity sensor and a signal processing circuit 1510 that performs signal processing, that is, controls the system 1502, based on an output signal from the vibrator device 1.

In this manner, the automobile 1500 as the vehicle includes the vibrator device 1 and the signal processing circuit 1510 that performs signal processing based on the output signal (oscillation signal) of the vibrator device 1. Therefore, the effect of the above-described vibrator device 1 can be enjoyed and high reliability can be exhibited.

In addition, in addition to the automobile 1500, examples of the vehicle provided with the vibrator device 1 may include a robot, a drone, a two-wheeled vehicle, an aircraft, a ship, a train, a rocket, a spacecraft, and the like.

Above, the vibrator device, the electronic apparatus, and the vehicle according to the disclosure have been described based on the illustrated embodiments, but the disclosure is not limited thereto, and the configuration of each portion can be replaced with any configuration having similar functions. In addition, any configuration member may be added to the disclosure. Moreover, each embodiment may be appropriately combined with each other.

What is claimed is:

1. A vibrator device comprising:
a base;
a circuit element disposed on the base;
a vibrating element disposed to at least partially overlap the circuit element in a plan view; and
a support substrate that is disposed between the circuit element and the vibrating element and supports the vibrating element, wherein vibrating element has a frequency adjustment portion that performs frequency adjustment by removing at least a part of the vibrating element, and the support substrate includes
- a base portion that supports the vibrating element,
- a support portion that supports the base portion,
- a beam portion that couples the base portion and the support portion, and
- a shielding portion that is connected to the beam portion, overlaps the frequency adjustment portion in a plan view, and has light shielding properties.

2. The vibrator device according to claim 1, wherein the vibrating element includes a vibration substrate and an electrode disposed on the vibration substrate, and the vibration substrate and the support substrate are formed of quartz crystals.

3. The vibrator device according to claim 2, wherein the vibration substrate and the support substrate have the same quartz crystal axis direction.

4. The vibrator device according to claim 1, wherein a metal film is disposed on the shielding portion.

5. The vibrator device according to claim 4, further comprising:
a wiring disposed on the support substrate and electrically coupled to the vibrating element, wherein
a thickness of the metal film is thicker than a thickness of the wiring.

6. The vibrator device according to claim 1, wherein the support substrate is coupled to the base in the support portion.

7. The vibrator device according to claim 1, wherein the vibrating element is a physical quantity sensor element that detects a physical quantity.

8. An electronic apparatus comprising:
the vibrator device according to claim 1; and
a signal processing circuit that performs signal processing based on an output signal of the vibrator device.

9. A vehicle comprising:
the vibrator device according to claim 1; and
a signal processing circuit that performs signal processing based on an output signal of the vibrator device.

10. A vibrator device comprising:
a base;
a circuit element disposed on the base;
a vibrating element disposed to at least partially overlap the circuit element in a plan view; and
a support substrate that is disposed between the circuit element and the vibrating element and supports the vibrating element, wherein the vibrating element has a frequency adjustment portion that performs frequency adjustment by removing at least a part of the vibrating element, and the support substrate includes
- a base portion that supports the vibrating element,
- a support portion that supports the base portion,
- a beam portion that couples the base portion and the support portion, and
- a shielding portion that is connected to the base portion, overlaps the frequency adjustment portion in a plan view, and has light shielding properties.

11. A vibrator device comprising:
a base;
a circuit element disposed on the base;
a vibrating element disposed to at least partially overlap the circuit element in a plan view; and
a support substrate that is disposed between the circuit element and the vibrating element and supports the vibrating element, wherein the vibrating element has a frequency adjustment portion that performs frequency adjustment by removing at least a part of the vibrating element, and the support substrate is formed of quartz crystals and includes
- a base portion that supports the vibrating element,
- a support portion that supports the base portion,
- a beam portion that couples the base portion and the support portion, and
- a shielding portion that is connected to the support portion, overlaps the frequency adjustment portion in a plan view, and has light shielding properties.

* * * * *